June 16, 1959 J. L. SCIURBA 2,891,146
MANUAL VOLUME CONTROL FOR TRANSISTOR AUDIO STAGE UTILIZING BOTH VARIABLE ATTENUATION AND VARIABLE DEGENERATION
Filed Dec. 7, 1956
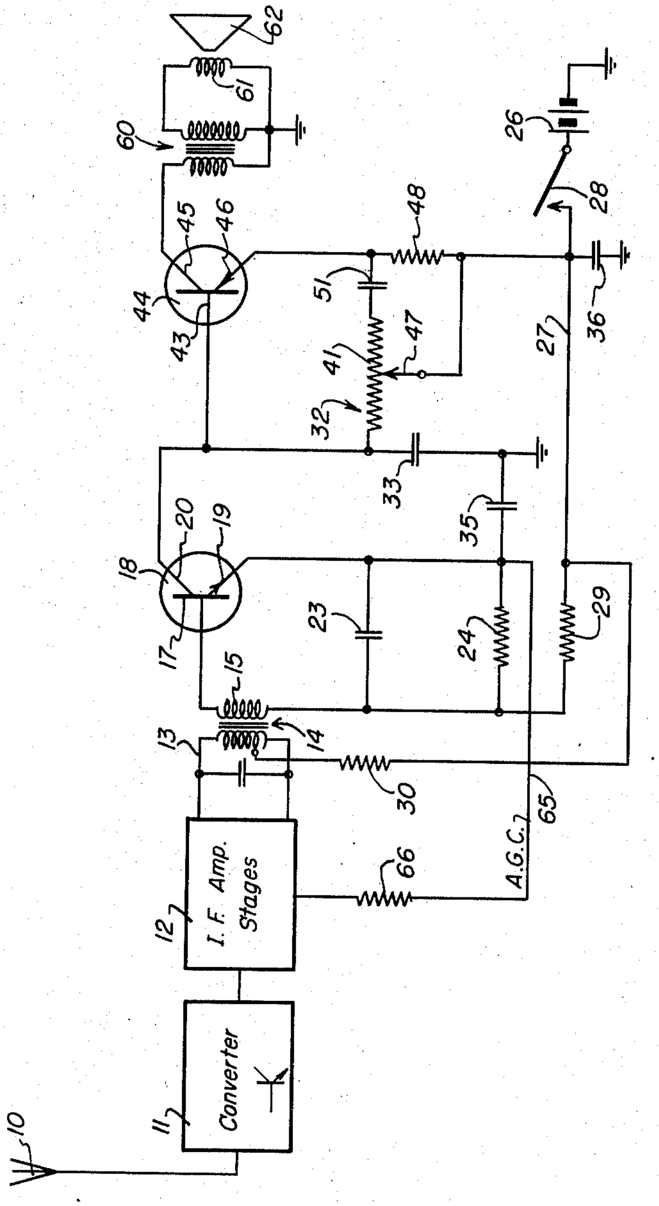
INVENTOR.
Jack L. Sciurba
BY
Mueller and Aichele
Attys.

United States Patent Office 2,891,146

Patented June 16, 1959

2,891,146

MANUAL VOLUME CONTROL FOR TRANSISTOR AUDIO STAGE UTILIZING BOTH VARIABLE ATTENUATION AND VARIABLE DEGENERATION

Jack L. Sciurba, Chicago, Ill., assignor to Motorola, Inc., Chicago, Ill., a corporation of Illinois Application December 7, 1956, Serial No. 626,862

5 Claims. (Cl. 250—20)

This invention relates to a transistor amplifier amplitude control, and more particularly to a volume control for a transistor radio receiver.

In transistor radio receivers having transistor detector and amplifier stages, a volume control resistor may form the detector load and controls the bias between the emitter and base electrodes of the transistor amplifier stage to control the volume thereof. In such a circuit a part of the resistor must always be left in the detector circuit to successfully detect the signal. However, where the amplifier stage has large gain, it is very difficult to obtain sufficient volume control while still providing sufficient resistance for detection. Another problem has been that the adjustment of the volume control resistor to low volume sometimes lowers the operating point of the transistor to such an extent that clipping of the signal occurs.

An object of the invention is to provide a new and improved volume control circuit for a transistor amplifier stage.

Another object of the invention is to provide a radio having transistor circuits which produce high gain, with a volume control for achieving low volume output.

A still further object of the invention is to provide transistor radio receiver having transistor detector and radio amplifier circuits with a volume control potentiometer effective to greatly reduce the volume of the output thereof.

A feature of the invention is the provision of a transistor audio amplifier stage having a volume control potentiometer in the input circuit of the stage, and a degenerative feedback network coupled to the volume control potentiometer to further reduce the output thereof and to prevent distortion.

Another feature of the invention is the provision of a transistor radio receiver having a detector circuit with the load thereof formed by a volume control potentiometer which also controls the bias of a transistor audio amplifier stage, and a lowpass capacitor connecting one end of the potentiometer to the common electrode of the transistor stage to control degenerative feedback in the stage. Since a part of this potentiometer must always remain in the circuit to form the detector load, the control produced thereby is limited, and this is supplemented by the degeneration action.

A further feature of the invention is the provision of a transistor amplifier stage having a volume control potentiometer connected at one end to the base of the transistor with a stabilizing resistor connected between the slider of the potentiometer and the emitter electrode of the transistor, and an audio frequency bypass condenser connected between the emitter electrode and the other end of the potentiometer so that adjustment of the potentiometer simultaneously controls the bias and degeneration of the stage.

In the drawing there is shown a circuit, partially in block diagram, forming one embodiment of the invention.

The invention provides a transistor radio receiver circuit including a transistor detector stage coupled to a transistor audio amplifier stage. A volume control potentiometer which forms the detector load is connected across the base and emitter electrodes of the audio amplifier stage for controlling the volume output thereof by adjustment of the detector circuit. A portion of the potentiometer is connected in series with a capacitor to the common emitter electrode of the transistor stage to provide degenerative feedback effect inversely proportional to the volume control setting of the audio amplifier stage, so that low volume settings may be made with the potentiometer still having sufficient resistance in the detector circuit to effect detection. This degenerative action prevents clipping of the input signals in the audio amplifier stage produced by shifting of the operating point of the audio amplifier transistor, since the degenerative feedback effect reduces the amplitude of the signals so that no clipping takes place, and distortion is thereby reduced.

The transistor radio receiver circuit shown in the drawing includes an antenna 10 coupled to a transistor converter stage 11 which supplies signals therefrom to transistorized intermediate frequency amplifier stages 12. The stage 12 has a tuned output circuit 13 including a transformer 14 which also has a secondary winding 15 connected to a detector stage including transistor 18. The winding 15 is connected to the base electrode 17 of the transistor 18 which also includes an emitter electrode 19 and a collector output electrode 20. The transistor 18 is connected in a common emitter circuit. The base electrode 17 and emitter electrode 19 are coupled by a radio frequency bypass capacitor 23, and a resistor 24 in parallel therewith. Battery 26 supplies positive potential from a line 27 through a switch 28 and a resistor 29 through the secondary winding 15 to the base electrode 17. Resistor 30 supplies B+ to the tuned circuit 13. An automatic gain control line 65 is connected to the emitter 19 of the detector stage 18 for providing an automatic gain control voltage which is applied through a resistor 66 to the intermediate frequency amplifier stages 12 and operates in a well known manner to reduce the gain thereof.

The transistor 18 forms the detector circuit along with a volume control potentiometer 32 and capacitors 33 and 35 and a filter capacitor 36 provided between the positive line 27 and ground. The capacitor 36 has sufficient capacitance to effectively ground audio frequency signals. The potentiometer 32 has a resistor portion 41 connected at one end to the collector 20 and the base 43 of the transistor in the audio frequency amplifier stage 44, which also has a collector electrode 45 and an emitter electrode 46. The emitter electrode 46 is connected by the slider 47 of the potentiometer and a stabilizing resistor 48 to the base electrode 43, and a large capacitor 51 is connected to the other end of the resistor 41 of the potentiometer 32 and to the emitter 46 in shunt with the resistor 48. The potentiometer 32 is of a well known type and has a stop so that the slider 47 may not be moved completely to the lefthand end of the resistor portion 32. This circuit provides always in the detector a sufficient portion of the resistor portion that detection of the audio frequency signals always is provided. The output circuit of the stage 44 composed of the collector electrode 45 and the emitter electrode 46 applies the output signals to the primary winding of a transformer 60. The transformer feeds the signals from secondary winding thereof to a voice coil 61 of a loudspeaker 62.

The input signals are detected by the circuit including transistor 18, volume control potentiometer 32 and the capacitor 33. The detected signals are applied to the base electrode 43 of transistor 44 the operating point of which is determined by the setting of the potentiometer. The stage 44 amplifies the audio input signals and applies them to the transformer 60 and the loudspeaker 62. As the slider 47 is moved toward the left, more of the detected signal is shunted so that the stage 44 has less output. However, in order for the volume control potentiometer 32 to retain its function in the detector circuits a part of the resistor 41 thereof must at all times be left in the detector section. Hence, the volume can be reduced only to a limited amount by the potentiometer itself. In order to further reduce the volume or output of the stage 44 at low volume settings of the potentiometer 32, the capacitor 51 provides degenerative feedback of the audio frequency signals to the input circuit of the transistor stage 44. This degenerative feedback reduces the volume further as the slider 47 is moved to the left. As the slider is moved to the right along the resistor portion 41 of potentiometer 32, more of the resistor portion 41 is cut out in the path including the capacitor 51 and the slider 47 so the degenerative feedback is reduced. For high volume settings of the volume control potentiometer 32, there is very little degenerative feedback applied to the input circuit of the audio frequency amplifier stage 44.

The provision of the degenerative feedback by the capacitor 51 has another effect, namely, that as the slider 47 is positioned near the lefthand end of the resistor 41, the operating point of the stage 44 is lowered to a point at which strong signals applied to the input circuit of the stage 44 which would normally be clipped somewhat. The high degenerative feedback reduces the amplitude of the input signals and thereby reduces the swing to such an extent that clipping and other distortion is prevented. Thus, the volume control of potentiometer 32 with the capacitor 51 serves not only to reduce the signal output of the stage 44 at low volume settings sufficiently that the volume is effectively reduced, but also eliminates distortion that sometimes would occur in the stage 44.

The following constants for the circuit illustrated are listed solely by way of example of a successful embodiment and are not intended to limit the scope of the invention in any way:

| | | |
|---|---|---|
| Resistor 24 | kilohms | 1 |
| Resistor 29 | do | 33 |
| Resistor 48 | ohms | 120 |
| Resistor 30 | do | 470 |
| Potentiometer 32 | kilohms [1] | 1 |
| Capacitor 23 | microfarads | .01 |
| Capacitor 33 | do | .04 |
| Capacitor 35 | do | 12 |
| Capacitor 36 | do | 50 |
| Capacitor 51 | do | 25 |
| Transistor 18 | | Type R35 |
| Transistor 44 | | Type 354 |

[1] 15 ohms minimum.

I claim:

1. In a transistor radio receiver, the combination including a detector stage having an output; a transistor amplifier stage having a transistor with an input electrode coupled to the output of said detector stage, said transistor having an output electrode and a common electrode; a volume control potentiometer having a slider and end terminals, means connecting one end terminal to the juncture of the output of said detector stage and said input electrode; a resistor connecting said slider of said potentiometer to said common electrode; and an audio frequency bypass capacitor connecting said common electrode and another terminal of said potentiometer to provide degenerative feedback for said transistor ampliger stage.

2. In a transistor amplifier stage, the combination including a transistor amplifier having a base input electrode, a collector output electrode and a common emitter electrode; a power supply; a resistor connecting said power supply to said emitter electrode; a volume control potentiometer having one end connected to said base electrode and a slider connected to said power supply and to said resistor; and an audio frequency bypass capacitor connecting the other end of said potentiometer to said emitter electrode in shunt with said resistor through a portion of said volume control potentiometer to provide degenerative feedback to said amplifier in inverse proportion to the setting of said volume control potentiometer.

3. In a transistor radio receiver; the combination including a first transistor stage; a transistor audio amplifier stage including a transistor having an input electrode direct current coupled to said first transistor stage, said transistor further having an output electrode and a common electrode; a volume control potentiometer having one end connected to the junction of the two stages and including a slider; a resistor connecting said common electrode to said slider; an audio frequency bypass capacitor connecting said common electrode to the other end of said potentiometer output circuit means coupled to said output electrode; and a power source supplying power to said slider and said resistor and to said output circuit means.

4. A signal level control for an amplifier circuit, including in combination, an electron discharge device having first and second input elements, a circuit including resistor means connected between said first input element and a reference point, a signal input circuit including a variable resistor with a portion coupled between said second element and the reference point whereby said resistor means is in the signal path for said first input element and may degenerate input signals, said variable resistor having a second portion variable oppositely to said first portion, and a capacitor series coupled with said second portion across said resistor means for varying the degeneration of input signals through signal bypassing by said capacitor.

5. A signal level control for an amplifier circuit, including in combination, a first transistor stage with an output circuit, a transistor amplifier stage having a transistor with first and second input elements and an output element, a circuit including resistor means connected between said first input element and a reference point, a circuit coupled from said output circuit to said second input element, a variable resistor with a portion coupled between said second element and the reference point whereby said resistor means is in the signal path for said first input element and may degenerate input signals, said variable resistor having a second portion variable oppositely to said first portion, a capacitor series coupled with said second portion across said resistor means for varying the degeneration of input signals through signal bypassing by said capacitor, and means for deriving signals from said output element.

References Cited in the file of this patent

UNITED STATES PATENTS

| | | |
|---|---|---|
| 2,246,158 | Worchester | June 17, 1941 |
| 2,653,226 | Mattingly | Sept. 22, 1953 |
| 2,802,100 | Beck | Aug. 6, 1957 |

OTHER REFERENCES

Radio Electronics for October, 1956, pp. 54 and 55.